(12) United States Patent
Li et al.

(10) Patent No.: US 9,296,007 B2
(45) Date of Patent: Mar. 29, 2016

(54) METHODS AND APPARATUSES FOR FORMING LARGE-AREA CARBON COATINGS (71) Applicant: The Boeing Company, Chicago, IL (US)

(72) Inventors: Angela W. Li, Everett, WA (US); Jeffrey H. Hunt, Thousand Oaks, CA (US); Wayne R. Howe, Irvine, CA (US)

(73) Assignee: The Boeing Company, Chicago, IL (US)

( * ) Notice: Subject to any disclaimer, the term of this patent is extended or adjusted under 35 U.S.C. 154(b) by 286 days.

(21) Appl. No.: 13/940,363

(22) Filed: Jul. 12, 2013

(65) Prior Publication Data

US 2015/0017429 A1   Jan. 15, 2015

(51) Int. Cl.
| | |
|---|---|
| B44C 1/17 | (2006.01) |
| B29C 65/48 | (2006.01) |
| B32B 37/02 | (2006.01) |
| B32B 37/12 | (2006.01) |
| B32B 38/10 | (2006.01) |
| B05C 1/08 | (2006.01) |
| C09D 1/00 | (2006.01) |
| B05C 1/02 | (2006.01) |
| B05C 17/02 | (2006.01) |
| B05D 1/28 | (2006.01) |
| H01B 1/04 | (2006.01) |
| B82Y 30/00 | (2011.01) |
| B05D 7/00 | (2006.01) |

(52) U.S. Cl.
CPC . *B05C 1/08* (2013.01); *B05C 1/027* (2013.01); *B05C 17/0207* (2013.01); *B05C 17/0212* (2013.01); *B05D 1/28* (2013.01); *C09D 1/00* (2013.01); *H01B 1/04* (2013.01); *B05C 17/0217* (2013.01); *B05D 7/52* (2013.01); *B82Y 30/00* (2013.01); *Y10T 428/26* (2015.01)

(58) Field of Classification Search
CPC ...... B05C 1/027; B05C 1/08; B05C 17/0207; B05C 17/0212; B05C 17/2017; H01B 1/00; H01B 1/04; B05D 1/28; B05D 7/24; B05D 7/52; B05D 3/002; C09D 1/00; B82Y 30/00; Y10T 428/26; B29C 63/0013; B29C 65/48; B32B 7/12; B32B 37/12; B32B 37/1284; B32B 37/24; B32B 2037/246; B32B 38/10; B32B 43/00
USPC .................. 156/230, 234, 241, 247
See application file for complete search history.

(56) References Cited

U.S. PATENT DOCUMENTS

2011/0100951 A1\* 5/2011 Juang et al. .................... 216/13
2011/0186786 A1\* 8/2011 Scheffer et al. ............... 252/510

OTHER PUBLICATIONS

U.S. Appl. No. 13/740,967, filed Jan. 14, 2013.

(Continued)

*Primary Examiner* — Sing P Chan
(74) *Attorney, Agent, or Firm* — Smith Moore Leatherwood LLP (57) ABSTRACT

In one aspect, methods of making a carbon coating are described herein. In some implementations, a method of making a carbon coating comprises applying a first adhesive material to a substrate surface to provide an adhesive surface; rolling a carbon source over the adhesive surface to provide a carbon layer on the adhesive surface; and rolling an adhesive roller over the carbon layer to remove some but not all of the carbon of the carbon layer to provide the carbon coating.

14 Claims, 2 Drawing Sheets

(56) References Cited

OTHER PUBLICATIONS

Novoselov, Geim et al., "Electric Field Effect in Atomically Thin Carbon Films," Science, vol. 306, Oct. 22, 2004, 666-669, 4 pages.

Zyga, "How to make graphene with a pencil and sticky tape," Dec. 7, 2010, retrieved on Jul. 12, 2013 from http://www.physorg.com/news/2010-12-graphene-pencil-sticky-tape-videos.html, 7 pages.

* cited by examiner

METHODS AND APPARATUSES FOR FORMING LARGE-AREA CARBON COATINGS

FIELD

This disclosure relates to large-area carbon coatings and, in particular, to carbon coatings comprising graphene or graphite.

BACKGROUND

The use of thin films or coatings of carbon has increased in recent years for various applications, including in electronics and coating technologies. However, creating inexpensive and large-area thin films of carbon has been difficult, particularly for films having thicknesses of less than 100 nm. Some previous methods of forming carbon coatings require the use of expensive and/or high-energy technologies. In addition, some previous methods require long growth and/or deposition times to provide a carbon coating having a desired thickness and/or morphology.

It has also been difficult to create thicker carbon coatings on large-area substrates in a rapid and inexpensive manner suitable for use in various coating applications.

Therefore, there exists a need for methods and apparatuses for forming large-scale carbon coatings in a rapid, cost-effective, and energy-efficient manner.

SUMMARY

In one aspect, methods of making carbon coatings are described herein which, in some implementations, may provide one or more advantages over previous methods. For example, in some implementations, a method described herein can be carried out using "top-down" deposition of carbon rather than "bottom-up" deposition of carbon. Further, such methods, in some cases, can provide thin coatings of carbon in a rapid, cost-effective, and/or energy efficient manner using "bulk" carbon starting materials. Moreover, carbon coatings formed by a method described herein, in some implementations, can comprise continuous coatings of graphene or graphite having a desired thickness, including a thickness below about 100 nm or a thickness up to about 1 mm. In addition, carbon coatings formed by a method described herein, in some cases, can comprise large-area coatings, such as coatings covering more than 0.25 $m^2$, more than 1 $m^2$, or more than 10 $m^2$ of a substrate surface.

In some implementations, a method of making a carbon coating comprises applying a first adhesive material to a substrate surface to provide an adhesive surface; and applying a carbon source to the adhesive surface to provide a carbon layer on the adhesive surface. Applying a carbon source to the adhesive surface, in some cases, comprises rolling a carbon source over the adhesive surface. In addition, in some implementations, the method further comprises applying a carbon remover to the carbon layer to remove some but not all of the carbon of the carbon layer to provide the carbon coating. Thus, in some implementations, the carbon coating has a lower average thickness than the carbon layer. In some cases, applying a carbon remover to the carbon layer comprises rolling an adhesive roller over the carbon layer. Moreover, in some instances, the adhesive roller comprises a second adhesive material differing from the first adhesive material. In some cases, the second adhesive material can be less adhesive to carbon than the first adhesive material is.

In addition, in some implementations described herein, the carbon source comprises graphite. For example, in some cases, the carbon source comprises a graphite rod or graphite sphere, either of which can be attached to a handle or other apparatus if desired. Thus, in some implementations, the carbon source is or is part of an apparatus comprising a handle and a graphite rod or sphere attached to the handle. The graphite rod or sphere can be configured to roll when the handle is moved in a direction tangential to a curved surface of the graphite rod or sphere.

Further, in some implementations, a carbon layer and/or a carbon coating provided by a method described herein can comprise graphene or graphite. Additionally, a carbon layer and/or a carbon coating, in some implementations, can have an average thickness of up to about 1000 nm or up to about 100 nm. For instance, in some implementations, a carbon coating comprises one or more graphene sheets having a total of 1 to 10 atomic layers. In other instances, a carbon layer and/or a carbon coating can have an average thickness of up to about 10 µm, up to about 100 µm, up to about 1 mm, or up to about 5 mm. Carbon layers and/or carbon coatings having such thicknesses, in some implementations, can provide high electrical conductivity to a substrate, including conductivity sufficient to transport currents or discharge charges such as electrostatic charges.

In another aspect, apparatuses for forming a carbon coating are described herein which, in some implementations, may provide one or more advantages over prior apparatuses. In some implementations, for example, an apparatus described herein provides thin films of carbon in a rapid, cost-effective, and/or energy efficient manner using bulk carbon starting materials. Moreover, in some cases, an apparatus described herein can provide a large-area, thin coating of carbon on a flat substrate surface or a curved substrate surface, including a concave or convex substrate surface. In some implementations, an apparatus for forming a carbon coating comprises a handle and a graphite rod or sphere attached to the handle, wherein the graphite rod or sphere is configured to roll or otherwise move when the handle is moved in a direction tangential to a surface of the graphite rod or sphere, such as a curved surface of the graphite rod or sphere. In addition, in some implementations, an apparatus described herein further comprises a moveable support structure attached to the handle. A moveable support structure, in some implementations, comprises a track mechanism. Moreover, in some implementations described herein, an apparatus comprises a plurality of handles attached to a plurality of graphite rods or spheres, each of the plurality of handles being attached to a moveable support structure. In addition, in some implementations, an apparatus described herein further comprises one or more detectors for determining the thickness of a carbon layer or carbon coating provided by the apparatus.

In another aspect, carbon-coated substrates are described herein. In some implementations, a carbon-coated substrate comprises a substrate surface; a carbon coating disposed on the substrate surface; and an adhesive layer disposed between and immediately adjacent to the substrate surface and the carbon coating. In some implementations, the carbon coating has a thickness of up to about 1000 nm or up to about 100 nm. In other instances, a carbon coating has an average thickness of up to about 10 µm, up to about 100 µm, up to about 1 mm, or up to about 5 mm. In some cases, the carbon coating comprises graphene.

These and other implementations are described in greater detail in the detailed description which follows.

DETAILED DESCRIPTION

Implementations described herein can be understood more readily by reference to the following detailed description, examples, and figures. Elements, apparatus, and methods described herein, however, are not limited to the specific implementations presented in the detailed description, examples, and figures. It should be recognized that these implementations are merely illustrative of the principles of the present disclosure. Numerous modifications and adaptations will be readily apparent to those of skill in the art without departing from the spirit and scope of the disclosure.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10" should generally be considered to include the end points 5 and 10.

Further, when the phrase "up to" is used in connection with an amount or quantity, it is to be understood that the amount is at least a detectable amount or quantity. For example, a material present in an amount "up to" a specified amount can be present from a detectable amount and up to and including the specified amount.

I. Methods of Making a Carbon Coating

In one aspect, methods of making a carbon coating are described herein. In some implementations, a method of making a carbon coating comprises applying a first adhesive material to a substrate surface to provide an adhesive surface; and applying a carbon source to the adhesive surface to provide a carbon layer on the adhesive surface. Applying a carbon source to an adhesive surface, in some implementations, comprises rolling the carbon source over the adhesive surface. Further, in some cases, one or both of the foregoing steps may be repeated a desired number of times to provide a thicker carbon layer and/or a stack of one or more carbon layers separated by one or more adhesive layers. Additionally, in some implementations, a method described herein further comprises applying a carbon remover to a carbon layer to remove some but not all of the carbon of the carbon layer to provide a carbon coating. Applying a carbon remover to a carbon layer, in some cases, can comprise rolling an adhesive roller over the carbon layer. In some implementations, the carbon coating has a lower average thickness than the carbon layer.

Moreover, in some instances, an adhesive roller described herein comprises an adhesive material disposed on the surface of the roller. This second adhesive material can be the same or different than the first adhesive material disposed on the substrate surface. In some implementations wherein the second adhesive material differs from the first adhesive material, the second adhesive material may be less adhesive to carbon than the first adhesive material is. Alternatively, in other implementations, the second adhesive material may be equally adhesive or more adhesive to carbon than the first adhesive material is.

In addition, in some implementations, a method described herein further comprises drying an adhesive material after formation of a carbon layer or carbon coating. Alternatively, in other instances, drying is not carried out.

Turning now to steps of methods, methods of making a carbon coating described herein, in some implementations, comprise applying a first adhesive material to a substrate surface to provide an adhesive surface. Any adhesive material not inconsistent with the objectives of the present disclosure may be used as the first adhesive material. In addition, a first adhesive material can be a fluid material or a solid material. In some implementations, a first adhesive material comprises an animal protein-based adhesive material such as a collagen glue, albumin glue, casein glue, or meat glue. In some implementations, a first adhesive material comprises bone glue, fish glue, hide glue, hoof glue, or rabbit skin glue. A first adhesive material can also comprise a plant-based adhesive material such as a resin or starch. In some implementations, a first adhesive material comprises a Canada balsam resin, coccoina, gum arabic resin, latex, methyl cellulose, mucilage, resorcinol resin, or urea-formaldehyde resin or a combination thereof. A first adhesive material can also comprise a synthetic adhesive material such as a synthetic monomer glue or a synthetic polymer glue. In some implementations, a first adhesive material comprises an acrylonitrile, a cyanoacrylate, or an acrylic glue or a combination thereof. In some implementations, a first adhesive material comprises an epoxy resin, an epoxy putty, an ethylene-vinyl acetate, a phenol formaldehyde resin, a polyamide, a polyester resin, a polyethylene hot-melt glue, a polypropylene glue, a polysulfide, a polyurethane, a polyvinyl acetate, a polyvinyl alcohol, a polyvinyl chloride, a polyvinylpyrrolidone, a rubber cement, a silicone, or a styrene acrylate copolymer, or a combination or mixture thereof. In some implementations, a first adhesive material comprises a solvent-based adhesive. In some implementations, a first adhesive material comprises a wet paint or primer or a partially dried paint or primer or other coating material.

Further, in some implementations, a first adhesive material described herein is selected based on a desired adhesiveness to carbon or to a carbon source described herein such as graphene or a graphite rod. The adhesiveness of an adhesive material to carbon or a carbon source can be measured in any manner not inconsistent with the objectives of the present disclosure. For example, in some implementations, the adhesion strength of an adhesive material described herein to carbon or a carbon source can be measured according to ASTM D4541. In some implementations, a first adhesive material described herein has an adhesion strength to carbon or a carbon source (such as graphite and/or graphene) that exceeds the inter-sheet bonding energy of graphite or graphene. Selecting an adhesive material having such an adhesion strength, in some implementations, can permit the formation of a carbon layer on an adhesive substrate surface by rolling the carbon source over the adhesive substrate layer, including without the exertion of excessive force toward the substrate surface. Therefore, in some implementations, a method described herein can provide a simple and cost-effective method of making a carbon coating, including over a large area.

In addition, to provide an adhesive surface, a first adhesive material described herein can be applied to a substrate surface in any manner not inconsistent with the objectives of the present disclosure. In some implementations, for example, a first adhesive material is sprayed, rolled, or brushed onto a substrate surface. In some implementations, a first adhesive material is daubed onto a substrate surface.

Further, a first adhesive material can be applied to a substrate surface in any amount not inconsistent with the objectives of the present disclosure. In some instances, for example, a first adhesive material forms an adhesive layer on the substrate surface, the adhesive layer having an average thickness of up to about 1 mm, up to about 0.5 mm, or up to about 500 μm. In some implementations, a first adhesive material forms an adhesive layer on the substrate surface having an average thickness of about 500 nm to about 1 mm or about 500 μm to about 0.5 mm.

Moreover, any substrate surface not inconsistent with the objectives of the present disclosure may be used. In some implementations, for example, a substrate surface comprises a metal surface, a semiconductor surface, a glass surface, or a plastic surface. In some implementations, a substrate surface comprises a composite material surface such as a fiberglass composite surface. Moreover, in some instances, a substrate surface is a coated surface, including a surface coated with one or more previously applied carbon layers or carbon coatings described herein. Further, in some implementations, a substrate surface is substantially flat or planar. Alternatively, in other implementations, a substrate surface is curved. In some cases, for instance, a substrate surface is concave or convex or includes one or more concave or convex portions.

In some implementations described herein, a substrate surface comprises a surface of a window or windshield. In some implementations, a substrate surface comprises a surface of an electronic component or an optical component. In some implementations, a substrate surface comprises an exterior surface of a vehicle such as an automobile, watercraft, or aircraft. Thus, in some implementations, a carbon coating described herein can be applied to the exterior surface of an aircraft such as an airplane or a watercraft such as a boat or submarine.

As described herein, some methods of making a carbon coating comprise applying an adhesive material to a substrate surface. However, in other implementations, a large-area carbon coating can be provided without applying an adhesive material to the substrate surface. Instead, in some cases, an initial carbon layer can be disposed on a substrate surface using electrostatic forces. In some implementations, for instance, a method of making a carbon coating comprises applying a carbon source having a first electrostatic charge to a substrate surface having a second electrostatic charge to provide a carbon layer on the substrate surface. The first and second electrostatic charges can differ. In some cases, for example, the carbon source is negatively charged such that the first electrostatic charge is a negative charge, and the substrate surface is positively charged such that the second electrostatic charge is positive. The opposite arrangement could also be used, wherein the carbon source is positively charged and the substrate surface is negatively charged. In addition, applying a carbon source to a substrate surface, in some implementations, can comprise rolling the carbon source over the substrate surface. Further, such a method of making a carbon coating, in some implementations, can further comprise applying a carbon remover to the carbon layer to remove some but not all of the carbon of the carbon layer to provide a carbon coating, as described further herein. Applying a carbon remover to a carbon layer, in some cases, comprises rolling an adhesive roller over the carbon layer. In such implementations, the adhesive roller can comprise any adhesive material described herein.

Methods described herein, in some implementations, also comprise applying a carbon source to an adhesive surface (or, alternatively, to an electrostatically charged substrate surface) to provide a carbon layer on the surface. A carbon source can be applied to an adhesive surface (or, alternatively, to an electrostatically charged substrate surface) in any manner not inconsistent with the objectives of the present disclosure. In some cases, for instance, a carbon source is rubbed, pressed, blotted, or daubed on or across a substrate surface. In other instances, applying a carbon source to a surface comprises rolling the carbon source over the surface.

In addition, any carbon source not inconsistent with the objectives of the present disclosure may be used. In some implementations, the carbon source comprises graphite, including alpha (hexagonal) graphite or beta (rhombohedral) graphite. Graphite, in some implementations, comprises crystalline graphite such as crystalline flake graphite. In some implementations, graphite comprises amorphous graphite or lump graphite. In some implementations, graphite comprises highly ordered or highly oriented pyrolytic graphite (HOPG). In some implementations, graphite comprises very high density graphite.

A carbon source can have any morphology not inconsistent with the objectives of the present disclosure, including a morphology configured to facilitate rolling of the carbon source on a substrate surface to provide a carbon layer. In some implementations, for instance, a carbon source comprises a graphite rod. A "rod," for reference purposes herein, has an aspect ratio greater than 1. In some implementations, a rod has an aspect ratio greater than 3, greater than 5, or greater than 10. A graphite rod can have any size and shape not inconsistent with the objectives of the present disclosure. In some implementations, for instance, a graphite rod has a cylindrical or substantially cylindrical shape. Further, in some cases, a graphite rod has a concave or convex surface. For example, in some cases, a graphite rod has an oblate spheroid shape. Graphite rods having a concave or convex surface, in some implementations, can be used to deposit a carbon layer on a curved substrate surface. For instance, in some cases, a graphite rod having a concave surface can be used to apply a carbon layer to a convex substrate surface. Thus, as understood by one of ordinary skill in the art, the size and shape of a graphite rod described herein can be selected based on the morphology of the substrate surface. In some implementations, for example, a large cylindrical graphite rod, such as an industrial-scale very high density graphite rod commercially available from Modern Ceramics Company, is selected for use with a large, substantially flat or planar substrate surface.

Moreover, in some implementations, a graphite rod described herein can have a tube morphology. For example, in some cases, a graphite rod has a drilled-out or hollow center. A tubular graphite rod, in some implementations, can be more easily coupled to a handle, holder, or other apparatus for rolling the graphite rod over a surface described herein.

In other implementations, a carbon source comprises a carbon sphere such as a graphite sphere. Further, a graphite sphere, in some implementations, comprises a drilled-out or hollow center to provide a spherical "stringed bead" morphology for coupling to a handle, holder, or other apparatus described hereinbelow in Section II.

In some implementations, a carbon source used in a method described herein is an apparatus comprising a handle and a graphite rod or sphere attached to the handle, wherein the graphite rod or sphere is configured to roll or otherwise move when the handle is moved in a direction tangential to a surface of the graphite rod or sphere, such as a curved surface of the graphite rod or sphere. The handle, in some implementations, is gripped and operated manually by a user. However, if desired, an apparatus can further comprise a moveable support structure, the handle being attached to the moveable support structure. In some cases, such a moveable support structure can be a mechanized or robotic support structure, thus providing automated application of a carbon layer, as described further hereinbelow.

A carbon layer formed by applying a carbon source to an adhesive surface or electrostatically charged substrate surface described herein can have any thickness, morphology, or chemical property not inconsistent with the objectives of the present disclosure. In some implementations, for instance, the carbon layer comprises graphene. In some implementations, the carbon layer consists or consists essentially of graphene. A "graphene" layer, for reference purposes herein, includes $sp^2$-bonded carbon as a primary carbon component, as opposed to $sp^3$-bonded carbon. In some implementations, a graphene layer described herein comprises no $sp^3$-hybridized carbon or substantially no $sp^3$-hybridized carbon. For example, in some implementations, a graphene layer comprises less than about 10 atom percent or less than about 5 atom percent $sp^3$-hybridized carbon, relative to the total amount of carbon in the layer. In some implementations, a graphene layer comprises less than about 2 atom percent or less than about 1 atom percent $sp^3$-hybridized carbon. Moreover, a graphene layer described herein, in some implementations, does not comprise, consist, or consist essentially of diamond-like carbon (DLC). In some implementations, a graphene layer comprises at least about 95 atom percent graphene carbon or consists essentially of graphene carbon.

In some implementations, a graphene layer comprises, consists, or consists essentially of one or more graphene sheets. A graphene sheet, in some implementations, comprises a single molecular or atomic layer having a flat planar structure. Any number of graphene sheets not inconsistent with the objectives of the present disclosure may be used. In some implementations, a graphene layer comprises a plurality of graphene sheets. The plurality of graphene sheets, in some implementations, can be arranged in a stacked or layered configuration. In other implementations, a graphene layer comprises or consists of a single graphene sheet. Therefore, in some implementations, a graphene layer described herein comprises 1 or more atomic layers of graphene. In some implementations, a graphene layer comprises between 1 and 1000 atomic layers of graphene. In some implementations, a graphene layer comprises between 1 and 500 or between 1 and 100 atomic layers of graphene. In some implementations, a graphene layer comprises between 1 and 5 atomic layers or between 1 and 3 atomic layers of graphene. In some implementations, a graphene layer comprises 1 atomic layer of graphene. Further, in some cases, a graphene layer comprises a sufficient number of atomic layers of graphene to provide a layer thickness of up to about 10 µm, up to about 100 µm, up to about 1 mm, or up to about 5 mm.

In addition, in some implementations, a carbon layer described herein is substantially continuous across the adhesive surface or other substrate surface, as opposed to being discontinuous or unevenly disposed on the surface. For example, in some cases, a continuous or substantially continuous layer covers at least about 90 percent, at least about 95 percent, at least about 99 percent, or at least about 99.9 percent of the adhesive surface or other substrate surface. Further, in some implementations, a carbon layer has a uniform or substantially uniform thickness across the adhesive surface or other substrate surface. A substantially uniform thickness, for reference purposes herein, comprises a thickness that varies by less than about 20 percent, less than about 10 percent, or less than about 5 percent, based on the average thickness of the layer.

A carbon layer described herein can have any thickness not inconsistent with the objectives of the present disclosure. In some implementations, for example, a carbon layer has an average thickness of up to about 10 µm, up to about 100 µm, up to about 1 mm, or up to about 5 mm. In other implementations, a carbon layer has an average thickness of up to about 1000 nm. In some implementations, a carbon layer has an average thickness of up to about 500 nm, up to about 300 nm, or up to about 200 nm. In some implementations, a carbon layer has an average thickness of about 100 nm or less. In some implementations, a carbon layer has an average thickness of about 50 nm or less, about 10 nm or less, or about 5 nm or less. In some implementations, a carbon layer has an average thickness of about 3 nm or less, about 2 nm or less, or about 1 nm or less. In some implementations, a carbon layer described herein has an average thickness greater than about 100 nm. In some implementations, a carbon layer has an average thickness from about 1 nm to about 1000 nm, from about 1 nm to about 500 nm, from about 1 nm to about 300 nm, from about 1 nm to about 100 nm, from about 10 nm to about 300 nm, from about 10 nm to about 100 nm, from about 100 nm to about 1000 nm, or from about 500 nm to about 1000 nm. In some implementations, a carbon layer has an average thickness from about 1000 nm to about 1000 µm. In some implementations, a carbon layer has an average thickness from about 10 µm to about 5 mm, from about 10 µm to about 1 mm, or from about 100 µm to about 1 mm.

Moreover, the thickness of a carbon layer described herein, in some implementations, can be selected by varying one or more parameters during deposition of the carbon layer on an adhesive surface or other substrate surface. For example, in some implementations, the thickness of the carbon layer is selected by varying the number of times or the force with which a carbon source is applied to or rolled across the surface, where the application of more force and/or repeated application of a carbon source can provide a thicker carbon layer. Further, an applied force or number of repetitions, in some implementations, can be selected using information obtained from a detector configured to determine the thickness of the carbon layer or coating deposited on the surface. In some implementations, the information is obtained in real-time by providing information regarding the output of the detector (e.g., a measured electrical conductivity change) to an apparatus used to deposit the carbon layer. Any detector not inconsistent with the objectives of the present disclosure may be used. In some implementations, for example, a detector comprises an acoustic wave detector configured to determine the thickness of the carbon layer. In other implementations, a detector is configured to determine the thickness of the carbon layer by measuring the optical absorption of the carbon layer. In some implementations, a detector is configured to determine the electrical conductivity of the carbon layer. Comparison of a measured acoustic wave value, optical absorption value, and/or electrical conductivity value with a theoretical value for a carbon layer of a specified thickness can, in some implementations, permit a user to determine the thickness of a carbon layer provided by a method described herein.

Methods described, in some implementations, further comprise applying a carbon remover to a carbon layer to remove some but not all of the carbon of the carbon layer to provide a carbon coating. A carbon remover can be applied to a carbon layer in any manner not inconsistent with the objectives of the present disclosure. For example, in some cases, a carbon remover is rubbed, pressed, blotted, or daubed on or across a carbon layer. Moreover, a carbon remover can comprise any apparatus not inconsistent with the objectives of the present disclosure. In some cases, a carbon remover comprises one or more planar surfaces which provide friction, abrasion, and/or adhesion to a carbon layer. In some instances, a carbon remover comprises one or more curved surfaces in addition to or instead of one or more planar surfaces. For instance, in some implementations, applying a carbon remover to a carbon layer comprises rolling an adhesive roller over the carbon layer. Any adhesive roller not inconsistent with the objectives of the present disclosure can be used. In some implementations, an adhesive roller comprises a second adhesive material disposed on a rolling surface of the adhesive roller.

Moreover, a planar, curved, or rolling surface of a carbon remover such as an adhesive roller described herein can have any size and/or morphology not inconsistent with the objectives of the present disclosure. In some implementations, for example, the rolling surface of an adhesive roller has the same size and/or shape as the carbon source used to provide the carbon layer. Thus, in some implementations, the rolling surface of an adhesive roller is concave or convex. Further, in some implementations, the rolling surface of an adhesive roller has an oblate spheroid shape. In some cases, the rolling surface of an adhesive roller has a cylindrical or substantially cylindrical shape. In some implementations, the size and/or shape of the planar, curved, or rolling surface of a carbon remover such as an adhesive roller is selected based on the morphology of the carbon source and/or the substrate surface.

Moreover, in some implementations, a carbon remover or adhesive roller described herein is coupled to a handle, holder, or other apparatus in a manner similar to that described above for a carbon source. Therefore, in some implementations, carbon remover or adhesive roller comprises an apparatus described hereinbelow in Section II.

In addition, the second adhesive material of an adhesive roller described herein can comprise any adhesive material not inconsistent with the objectives of the present disclosure. In some implementations, the second adhesive material comprises an adhesive material described hereinabove for use as the first adhesive material. However, in some implementations, the second adhesive material differs from the first adhesive material.

Moreover, in some implementations, the second adhesive material is less adhesive to carbon or a carbon source described herein than the first adhesive material is, when the adhesion strengths of the first and second adhesive materials are measured in the same manner, such as according to ASTM D4541. In some implementations, a second adhesive material described herein has an adhesion strength to carbon or a carbon source (such as graphite and/or graphene) that exceeds the inter-sheet bonding energy of graphite or graphene. In some implementations, a second adhesive material described herein has an adhesion strength to carbon or a carbon source that is the same as or less than the inter-sheet bonding energy of graphite or graphene. In some implementations, the second adhesive material is selected based on a desired adhesiveness to carbon or a carbon source, including relative to the adhesiveness of the first adhesive material to carbon or a carbon source. For example, in some implementations, the ratio of the adhesion strength to carbon or a carbon source of the second adhesive material to the adhesion strength to carbon or a carbon source of the first adhesive material is up to about 0.5:1, up to about 0.8:1, or up to about 0.99:1. In some implementations, the ratio of the adhesion strength to carbon or a carbon source of the second adhesive material to the adhesion strength to carbon or a carbon source of the first adhesive material is from about 0.1:1 to about 1:1, from about 0.1:1 to about 0.95:1, from about 0.3:1 to about 0.9:1, from about 0.3:1 to about 0.7:1, from about 0.5:1 to about 0.9:1, from about 0.5:1 to about 0.7:1, from about 0.7:1 to about 0.99:1, or from about 0.7:1 to about 0.95:1. Selecting first and second adhesive materials having such a ratio of adhesion strengths to carbon or a carbon source, in some implementations, can permit the removal of some but not all of the carbon of a carbon layer from an adhesive substrate or other substrate described herein. Therefore, in some implementations, a method described herein can provide a simple and cost-effective method of making a thin carbon coating, including over a large area.

However, if desired, the removal step can be omitted entirely from a method described herein. In some such implementations, the carbon layer applied to the substrate surface by the carbon source can be the final carbon coating.

A carbon coating formed by a method described herein can have any thickness, morphology, or chemical property not inconsistent with the objectives of the present disclosure. In some implementations, for instance, the carbon coating comprises graphene. In some implementations, the carbon coating comprises at least about 95 atom percent graphene carbon or consists essentially of graphene. In some implementations, a graphene coating comprises, consists, or consists essentially of one or more graphene sheets. A graphene sheet, in some implementations, comprises a single molecular or atomic layer having a flat planar structure. Any number of graphene sheets not inconsistent with the objectives of the present disclosure may be used. In some implementations, a graphene coating comprises a plurality of graphene sheets. The plurality of graphene sheets, in some implementations, can be arranged in a stacked or layered configuration. In other implementations, a graphene coating comprises or consists of a single graphene sheet. Therefore, in some implementations, a graphene coating described herein comprises 1 or more atomic layers of graphene. In some implementations, a graphene coating comprises between 1 and 1000 atomic layers of graphene. In some implementations, a graphene coating comprises between 1 and 500 or between 1 and 100 atomic layers of graphene. In some implementations, a graphene coating comprises between 1 and 5 atomic layers or between 1 and 3 atomic layers of graphene. In some implementations, a graphene coating comprises 1 atomic layer of graphene. Further, in some cases, a graphene coating comprises a sufficient number of atomic layers of graphene to provide a layer thickness of up to about 10 μm, up to about 100 μm, up to about 1 mm, or up to about 5 mm.

In addition, in some implementations, a carbon coating provided by a method described herein is substantially continuous across the adhesive surface or other substrate surface, as opposed to being discontinuous or unevenly disposed on the surface. Further, in some implementations, a carbon coating has a uniform or substantially uniform thickness across the adhesive surface or other substrate surface. A substantially uniform thickness, for reference purposes herein, comprises a thickness that varies by less than about 20 percent, less than about 10 percent, or less than about 5 percent, based on the average thickness of the coating.

A carbon coating described herein can have any thickness not inconsistent with the objectives of the present disclosure. In some implementations, the carbon coating is thinner than the carbon layer from which the carbon coating was formed. In some implementations, a carbon coating has an average thickness of up to about 10 µm, up to about 100 µm, up to about 1 mm, or up to about 5 mm. In other implementations, a carbon coating has an average thickness of up to about 1000 nm. In some implementations, a carbon coating has an average thickness of up to about 500 nm, up to about 300 nm, or up to about 200 nm. In some implementations, a carbon coating has an average thickness of about 100 nm or less. In some implementations, a carbon coating has an average thickness of about 50 nm or less, about 10 nm or less, or about 5 nm or less. In some implementations, a carbon coating has an average thickness of about 3 nm or less, about 2 nm or less, or about 1 nm or less. In some implementations, a carbon coating described herein has an average thickness greater than about 100 nm. In some implementations, a carbon coating has an average thickness from about 1 nm to about 1000 nm, from about 1 nm to about 500 nm, from about 1 nm to about 300 nm, from about 1 nm to about 100 nm, from about 10 nm to about 300 nm, from about 10 nm to about 100 nm, from about 100 nm to about 1000 nm, or from about 500 nm to about 1000 nm. In some implementations, a carbon coating has an average thickness from about 10 µm to about 5 mm, from about 10 µm to about 1 mm, or from about 100 µm to about 1 mm.

Moreover, the thickness of a carbon coating described herein, in some implementations, can be selected by varying one or more parameters during removal of a portion of the carbon layer. For example, in some implementations, the thickness of the carbon coating is selected by varying the number of times or the force with which a carbon remover such as an adhesive roller is rolled across or otherwise applied to the carbon layer, where the application of more force and/or repeated application or rolling of a carbon remover such as an adhesive roller can provide a thinner carbon coating. Further, an applied force or number of repetitions, in some implementations, can be selected using information obtained from a detector configured to determine the thickness of the carbon coating on the surface. In some implementations, the information is obtained in real-time by providing information regarding the output of the detector (e.g., a measured electrical conductivity change) to an apparatus used to remove a portion of the carbon coating. Any detector not inconsistent with the objectives of the present disclosure may be used. In some implementations, for example, a detector comprises an acoustic wave detector configured to determine the thickness of the carbon coating. In other implementations, a detector is configured to determine the thickness of the carbon coating by measuring the optical absorption of the carbon coating. In some implementations, a detector is configured to determine the electrical conductivity of the carbon coating. Comparison of a measured acoustic wave value, optical absorption value, and/or electrical conductivity value with a theoretical value for a carbon coating of a specified thickness can, in some implementations, permit a user to determine the thickness of a carbon coating provided by a method described herein.

Additionally, in some implementations, a carbon coating applied to a substrate surface described herein covers more than about 0.25 $m^2$, more than about 1 $m^2$, more than about 10 $m^2$, or more than about 100 $m^2$ of the substrate surface, including in a continuous or substantially continuous manner. In some implementations, a carbon coating covers between about 0.25 $m^2$ and about 1 $m^2$, between about 0.25 $m^2$ and about 10 $m^2$, between about 1 $m^2$ and about 10 $m^2$, or between about 5 $m^2$ and about 50 $m^2$ of the substrate surface.

Further, a carbon coating described herein, in some implementations, can exhibit one or more desired properties. In some implementations, for instance, a carbon coating described herein exhibits a high optical transparency, including in the visible region of the electromagnetic spectrum. For reference purposes herein, optical transparency is relative to the total amount of incident radiation in a given wavelength range. Optical transparency can be measured with a broad spectral source or a narrow spectral source. Moreover, the optical transparency of a carbon coating can be measured in any manner not inconsistent with the objectives of the present disclosure, including with any suitable instrumentation. For example, in some implementations, optical transparency is measured with a spectrometer such as a BECKMAN spectrometer.

In some implementations, a carbon coating described herein exhibits an optical transparency of at least about 90 percent or at least about 95 percent between about 350 nm and about 750 nm. In some implementations, a carbon coating exhibits a transparency of at least about 98 percent between about 350 nm and about 750 nm. In some implementations, a carbon coating exhibits a transparency of at least about 99.9 percent or at least about 99.99 percent between about 350 nm and about 750 nm. In some implementations, a carbon coating exhibits an optical transparency between about 90 percent and about 99.99 percent or between about 95 percent and about 98 percent at wavelengths between about 350 nm and about 750 nm. Moreover, in some implementations, a carbon coating described herein exhibits an optical transparency of about 85 percent to about 99.99 percent or about 90 percent to about 95 percent at wavelengths between about 200 nm and about 800 nm or between about 220 nm and about 350 nm.

Moreover, in some implementations, a carbon coating described herein exhibits a high mechanical hardness, stiffness, or resistance to compression.

Some exemplary implementations of methods described herein will now be described with reference to the figures. FIGS. 1A-D illustrates a sectional view of steps of a method according to one implementation described herein. As understood by one of ordinary skill in the art, the various elements depicted in FIGS. 1A-D are representational and are not necessarily drawn to scale.

Figure 1A:
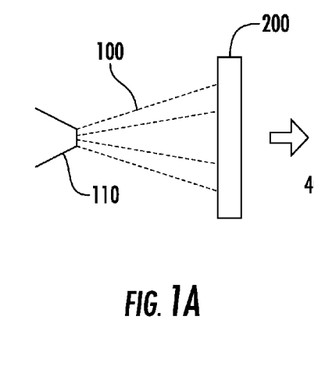
FIG. 1A illustrates a sectional view of a step of a method according to one implementation described herein.

As illustrated in FIGS. 1A-D, a first adhesive material (100) is applied to a substrate surface (200) to provide an adhesive surface (210). As illustrated in FIG. 1A, the adhesive material (100) is sprayed from a nozzle (110). However, as described herein, an adhesive material (100) can also be applied in other manners as well, such as by rolling, brushing, or daubing.

Figure 1B:
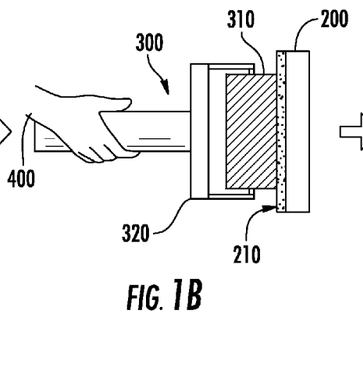
FIG. 1B illustrates a sectional view of a step of a method according to one implementation described herein.

Next, a first apparatus (300) comprising a carbon source (310) is rolled over the adhesive surface (210) to provide a carbon layer (220) on the adhesive surface (210). As illustrated in FIG. 1B, the first apparatus (300) comprises a handle (320), and the carbon source (310) is attached to the handle (320). A user (400) uses the apparatus (300) to roll the carbon source (310) over the adhesive surface (210) manually. However, as described herein, it is also possible to roll the carbon source (310) over the adhesive surface (210) using an automated, mechanized, or robotic apparatus.

Figures 1C, 1D:
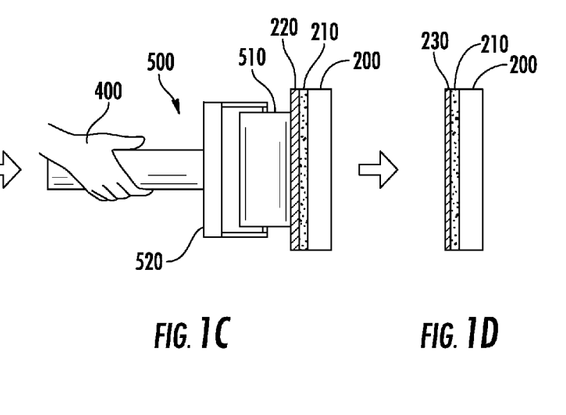
FIG. 1C illustrates a sectional view of a step of a method according to one implementation described herein.
FIG. 1D illustrates a sectional view of a step of a method according to one implementation described herein.

Following deposition of the carbon layer (220), a second apparatus (500) comprising an adhesive roller (510) is rolled over the carbon layer (220) to remove some but not all of the carbon of the carbon layer to provide a carbon coating (230). As illustrated in FIG. 1C, the second apparatus (500) comprises a handle (520) to which the adhesive roller (510) is attached. The user (400) uses the second apparatus (500) to manually roll the adhesive roller (510) over the carbon layer (220) to provide the final carbon coating (230). Again, however, it is also possible for the adhesive roller (510) to be operated using an automated, mechanized, or robotic apparatus. In any event, as illustrated in FIG. 1D, the application of the adhesive roller (510) provides a final carbon coating (230) that has a lower average thickness than the initial carbon layer (220).

As illustrated in FIG. 1B and FIG. 1C, carbon source (310) and adhesive roller (510) have substantially cylindrical morphologies. Such cylindrical morphologies, in some instances, may be especially suitable for use with a substantially flat or planar substrate surface, such as substrate surface (200) in FIG. 1A. However, as described herein, other configurations are also possible.

Figure 2:
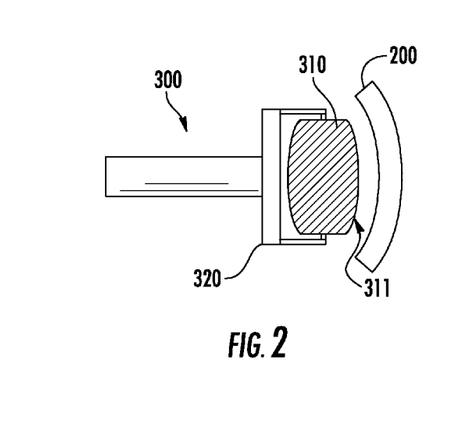
FIG. 2 illustrates a sectional view of an apparatus according to one implementation described herein.

For example, FIG. 2 illustrates an apparatus (300) designed for use with a concave substrate surface (200). The apparatus (300) comprises a handle (320) and a carbon source (310) attached to the handle (320). The carbon source (310) has an oblate spheroid shape, wherein the curvature of the oblate spheroid is matched to the curvature of the concave substrate surface (200) in a complementary manner.

Figure 3:
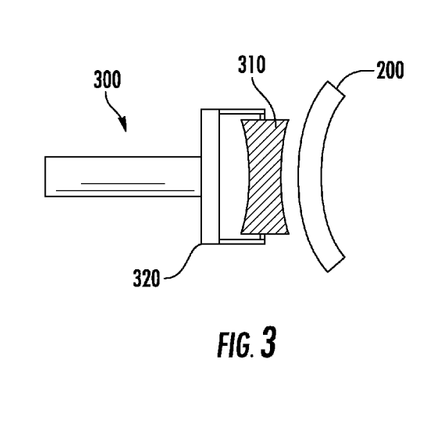
FIG. 3 illustrates a sectional view of an apparatus according to one implementation described herein.

Similarly, FIG. 3 illustrates an apparatus (300) designed for use with a convex substrate surface (200). The apparatus (300) comprises a handle (320) and a carbon source (310) attached to the handle (320). The carbon source (310) has a concave shape, wherein the curvature of the concave carbon source (310) is matched to the curvature of the convex substrate surface (200) in a complementary manner.

Figure 4:
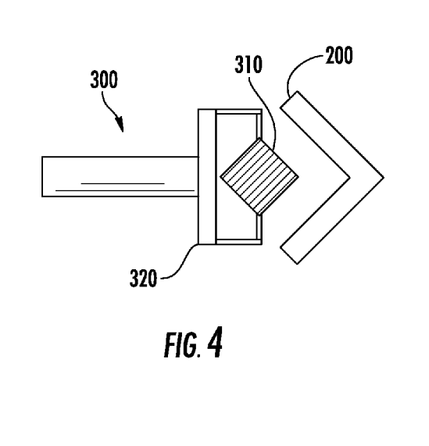
FIG. 4 illustrates a sectional view of an apparatus according to one implementation described herein.

FIG. 4 illustrates an apparatus (300) designed for use with a sharply angled substrate surface (200), such as a corner surface. The apparatus (300) comprises a handle (320) and a carbon source (310) attached to the handle (320). The carbon source (310) has a diamond-like shape, wherein the angles and surfaces of the diamond-shaped carbon source (310) are matched to the topology of the angled substrate surface (200) in a complementary manner.

In addition, as understood by one of ordinary skill in the art, a carbon remover such as an adhesive roller described herein can also have a size and shape such as that depicted for the carbon source (310) in FIGS. 2-4. Thus, the apparatus (300) of one of FIGS. 2-4 could also be used as carbon remover apparatus such as an adhesive roller apparatus, provided that the carbon source (310) were replaced by an adhesive roller or other appropriate abrasive or adhesive surface described herein.

II. Apparatuses for Forming a Carbon Coating

In another aspect, apparatuses for forming a carbon coating are described herein. In some implementations, an apparatus for forming a carbon coating comprises a handle and a carbon source attached to the handle, wherein the carbon source has a at least one surface such as a curved surface that is configured to roll or otherwise move when the handle is moved in a direction tangential to the surface of the carbon source. In addition, in some implementations, an apparatus described herein further comprises a moveable support structure attached to the handle. A moveable support structure, in some implementations, comprises a track mechanism. Moreover, in some implementations described herein, an apparatus comprises a plurality of handles attached to a plurality of carbon sources, each of the plurality of handles being attached to a moveable support structure. In some implementations, a carbon source of an apparatus described herein comprises a carbon source described hereinabove in Section I. For example, in some implementations, a carbon source comprises a graphite rod or sphere.

Thus, an apparatus described herein, in some implementations, is a carbon applicator or roller that can contact a large area of carbon (such as graphite) with a substrate. Further, as understood by one of ordinary skill in the art, an apparatus described herein, in some implementations, can deposit carbon on a substrate surface in a manner that differs from the deposition of carbon by other apparatuses, such as pencils, wherein the carbon source (such as graphite) is not rolled across the surface.

In addition, in some implementations, one or more carbon sources of an apparatus described herein can be replaced by a carbon remover such as an adhesive roller described herein. Thus, in some implementations, the apparatus or a portion thereof can be used to remove a portion of a carbon layer, including in a manner described hereinabove in Section I. For example, in some implementations, an apparatus for forming a carbon coating comprises a handle and an adhesive roller attached to the handle, wherein the adhesive roller has a curved surface and is configured to roll when the handle is moved in a direction tangential to a curved surface of the adhesive roller. Further, in some implementations, an apparatus for forming a carbon coating comprises a first handle, a carbon source attached to the first handle, a second handle, and an adhesive roller attached to the second handle, wherein the carbon source and the adhesive roller are configured to roll over the same or substantially the same area of a substrate when the first and second handles are moved in a direction tangential to a curved surface of the carbon source or adhesive roller. In some such implementations, the apparatus is configured to roll the carbon source over an area of the substrate before rolling the adhesive roller over the area.

Additionally, in some implementations, an apparatus described herein further comprises one or more detectors for determining the thickness of a carbon layer or carbon coating provided by the apparatus. Any detector not inconsistent with the objectives of the present disclosure may be used. In some implementations, for example, a detector comprises an acoustic wave detector configured to determine the thickness of the carbon layer or coating. In other implementations, a detector is configured to determine the thickness of the carbon layer or coating by measuring the optical absorption of the carbon layer or coating. In some implementations, a detector is configured to determine the electrical conductivity of the carbon layer or coating. Comparison of a measured acoustic wave value, optical absorption value, and/or electrical conductivity value with a theoretical value for a carbon layer or coating of a specified thickness can, in some implementations, permit a user to determine the thickness of a carbon layer or coating provided by an apparatus described herein. As understood by one of ordinary skill in the art, it is also possible for the thickness, electrical conductivity, optical transparency, and/or other property of a carbon layer or coating described herein to be determined in other manners or using other devices, mechanisms, or apparatuses.

Some exemplary implementations of apparatuses described herein are illustrated in FIGS. 1-4, as described above. For example, the apparatus (300) of FIG. 2 comprises a handle (320) and a carbon source (310) attached to the handle (320), wherein the carbon source has a curved surface (311) and is configured to roll when the handle (320) is moved in a direction tangential to the curved surface of the carbon source, such as a direction perpendicular to the plane of the paper in FIG. 2.

Figures 5, 6:
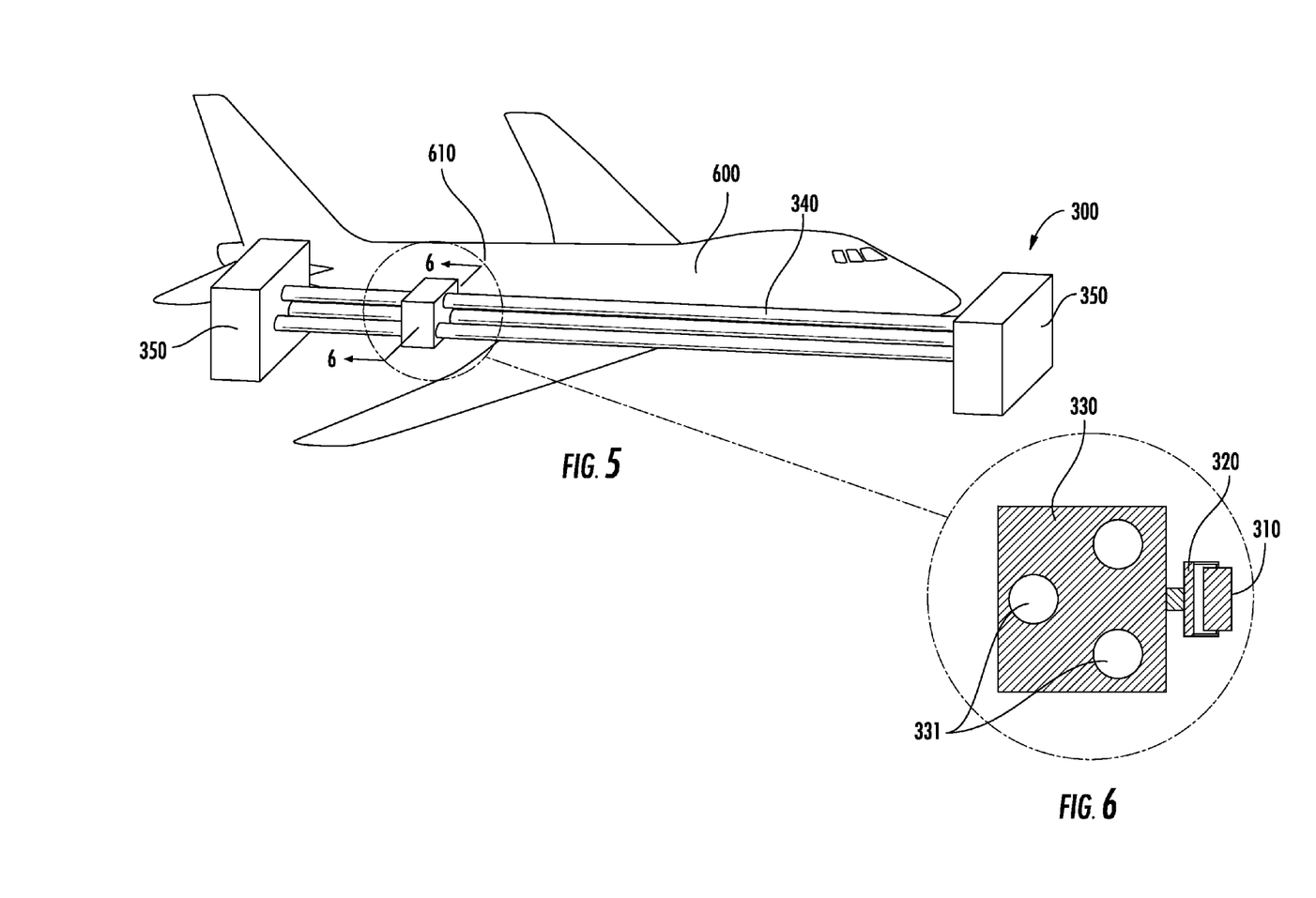
FIG. 5 illustrates a perspective view of an apparatus according to one implementation described herein.
FIG. 6 illustrates a sectional view of a portion of the apparatus of FIG. 5 taken along lines 6-6.

FIGS. 5 and 6 illustrate an apparatus (300) according to one implementation described herein that further comprises a moveable support structure (330) attached to the handle (320) of the apparatus (300). FIG. 5 illustrates a perspective view of the apparatus (300). FIG. 6 illustrates a sectional view of the highlighted portion of the apparatus (300) of FIG. 5 along lines 6-6. In the implementation of FIG. 5 and FIG. 6, the moveable support structure (330) comprises a track mechanism. Specifically, the moveable support structure (330) comprises guide rail holes (331) configured to couple to one or more guide rails (340) of the apparatus (300). As illustrated in FIG. 5, guide rail (340) is disposed between scaffolds (350) and is configured to permit the movement of the support structure (330), handle (320), and carbon source (310) along the length of the guide rail (340). The apparatus (300) can further comprise a motor (not shown) and a controller (not shown) configured to control and power the movement of the support structure (330), handle (320), and carbon source (310) along the length of the guide rail (340). By moving the support structure (330), handle (320), and carbon source (310) along the length of the guide rail (340) between scaffolds (350), the apparatus (300) can be used to provide a carbon coating (not shown) on a surface (610) of a large object such as an airplane (600) in a rapid, efficient, and cost-effective manner. In addition, in some implementations, the scaffolds (350) can be configured to move in one or more dimensions, such as in a vertical dimension or to trace a curve. The scaffolds (350) may also be equipped with a robotic arm for three-dimensional movement.

III. Carbon-Coated Substrates

In another aspect, carbon-coated substrates are described herein. In some implementations, a carbon-coated substrate comprises a substrate surface; a carbon coating disposed on the substrate surface; and an adhesive layer disposed between and immediately adjacent to the substrate surface and the carbon coating. In some implementations, the carbon coating is a coating formed by a method described hereinabove in Section I and/or using an apparatus described hereinabove in Section II. In addition, in some implementations, a carbon-coated substrate comprises a plurality of carbon coatings arranged in a stacked configuration. Moreover, in some cases, an adhesive layer is disposed between one or more of the carbon coatings. For example, in some cases, a carbon-coated substrate described herein comprises a substrate surface; a first carbon coating disposed on the substrate surface; a first adhesive layer disposed between and immediately adjacent to the substrate surface and the first carbon coating; a second adhesive layer disposed on the first carbon coating; and a second carbon coating disposed on the second adhesive layer.

Turning now to components of carbon-coated substrates, carbon-coated substrates described herein comprise a substrate surface. Any substrate surface not inconsistent with the objectives of the present disclosure may be used. In some implementations, a substrate surface comprises a substrate surface described hereinabove in Section I. For example, in some implementations, a substrate surface is substantially flat or planar. Alternatively, in other implementations, a substrate surface is curved. In some cases, for instance, a substrate surface is concave or convex or includes one or more concave or convex portions. In some implementations described herein, a substrate surface comprises a surface of a window or windshield. In some implementations, a substrate surface comprises a surface of an electronic component or an optical component. In some implementations, a substrate surface comprises an exterior surface of a vehicle such as an automobile, watercraft, or aircraft.

Carbon-coated substrates described herein also comprise a carbon coating disposed on the substrate surface. The carbon coating can comprise any carbon coating described hereinabove in Section I. In some implementations, for example, the carbon coating comprises, consists, or consists essentially of a graphene layer. In addition, in some implementations, the carbon coating has a thickness of up to about 1000 nm or up to about 100 nm. In some implementations, the carbon coating comprises one or more graphene sheets having a total of 1 to 10 atomic layers. Further, in some implementations, a carbon coating disposed on a substrate surface described herein and having a thickness described herein covers more than about 0.25 $m^2$, more than about 1 $m^2$, more than about 10 $m^2$, or more than about 100 $m^2$ of the substrate surface, including in a continuous or substantially continuous manner. In some implementations, a carbon coating covers between about 0.25 $m^2$ and about 1 $m^2$, between about 0.25 $m^2$ and about 10 $m^2$, between about 1 $m^2$ and about 100 $m^2$, or between about 5 $m^2$ and about 50 $m^2$ of the substrate surface.

Carbon-coated substrates described herein also comprise an adhesive layer disposed between and immediately adjacent to the substrate surface and the carbon coating. The adhesive layer can comprise any adhesive material and have any thickness of an adhesive layer described hereinabove in Section I. For example, in some implementations, the adhesive layer comprises a first adhesive material described herein, such as a polymeric adhesive material or a wet or partially dried paint or primer.

Various implementations of the disclosure have been described in fulfillment of the various objectives of the disclosure. It should be recognized that these implementations are merely illustrative of the principles of the present disclosure. Numerous modifications and adaptations thereof will be readily apparent to those skilled in the art without departing from the spirit and scope of the disclosure.

That which is claimed is:

1. A method of making a carbon coating comprising:
applying a first adhesive material to a substrate surface to provide an adhesive surface;
rolling a carbon source over the adhesive surface to provide a carbon layer on the adhesive surface; and
rolling an adhesive roller over the carbon layer to remove some but not all of the carbon of the carbon layer to provide a carbon coating.

2. The method of claim 1, wherein the carbon coating has a lower average thickness than the carbon layer.

3. The method of claim 1, wherein the adhesive roller comprises a second adhesive material differing from the first adhesive material.

4. The method of claim 3, wherein the second adhesive material is less adhesive to carbon than the first adhesive material is.

5. The method of claim 1, wherein the carbon source comprises graphite.

6. The method of claim 1, wherein the carbon layer comprises graphene.

7. The method of claim 1, wherein the carbon layer is substantially continuous across the adhesive surface.

8. The method of claim 1, wherein the carbon layer has an average thickness of up to about 1000 µm.

9. The method of claim 1, wherein the carbon coating comprises graphene.

10. The method of claim 1, wherein the carbon coating is substantially continuous across the adhesive surface.

11. The method of claim 1, wherein the carbon coating has an average thickness of up to about 100 nm.

12. The method of claim 1, wherein the carbon coating comprises one or more graphene sheets having a total of 1 to 10 atomic layers.

13. A method of making a carbon coating comprising:
   applying a first adhesive material to a substrate surface to provide an adhesive surface and
   rolling a carbon source over the adhesive surface to provide a carbon layer on the adhesive surface,
wherein the carbon source comprises a graphite rod.

14. A method of making a carbon coating comprising:
   applying a first adhesive material to a substrate surface to provide an adhesive surface; and
   rolling a carbon source over the adhesive surface to provide a carbon layer on the adhesive surface,
wherein the carbon source is an apparatus comprising a handle and a graphite rod or sphere attached to the handle, wherein the graphite rod or sphere is configured to roll when the handle is moved in a direction tangential to a curved surface of the graphite rod or sphere.

* * * * *